US012658278B2

(12) United States Patent
Lee et al.

(10) Patent No.: US 12,658,278 B2
(45) Date of Patent: Jun. 16, 2026

(54) PAGE BUFFER BLOCK AND MEMORY DEVICE INCLUDING THE SAME

(71) Applicant: Samsung Electronics Co., Ltd.,
Suwon-si (KR)

(72) Inventors: Jaeyun Lee, Suwon-si (KR); Makoto Hirano, Suwon-si (KR); Sangsoo Park, Suwon-si (KR); Jaeduk Yu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 221 days.

(21) Appl. No.: 18/394,640

(22) Filed: Dec. 22, 2023

(65) Prior Publication Data

US 2024/0249794 A1     Jul. 25, 2024

(30) Foreign Application Priority Data

Jan. 25, 2023    (KR) ........................ 10-2023-0009542

(51) Int. Cl.
| | |
|---|---|
| *G11C 29/52* | (2006.01) |
| *G11C 7/10* | (2006.01) |
| *G11C 29/02* | (2006.01) |

(52) U.S. Cl.
CPC .............. *G11C 29/52* (2013.01); *G11C 7/106* (2013.01); *G11C 29/022* (2013.01)

(58) Field of Classification Search
CPC ....... G11C 29/52; G11C 7/106; G11C 29/022; G11C 16/10; G11C 16/08; G11C 16/3459; G11C 16/0483
See application file for complete search history.

(56) References Cited

U.S. PATENT DOCUMENTS

| | | | |
|---|---|---|---|
| 6,816,421 | B2 | 11/2004 | Tanzawa et al. |
| 7,512,020 | B2 | 3/2009 | Lee |
| 7,675,777 | B2 | 3/2010 | Lee et al. |
| 7,872,925 | B2 | 1/2011 | Lee et al. |
| 8,040,726 | B2 | 10/2011 | Kwak |
| 9,870,833 | B2 | 1/2018 | Lim et al. |
| 10,629,279 | B2 | 4/2020 | Yun et al. |
| 11,037,629 | B2 | 6/2021 | Ko et al. |
| 2007/0002623 | A1* | 1/2007 | Won ........................ G11C 16/08 |
| | | | 365/185.12 |
| 2008/0266956 | A1* | 10/2008 | Byeon .................. G11C 29/806 |
| | | | 365/185.11 |
| 2018/0211706 | A1* | 7/2018 | Haibi ........................ G11C 8/08 |

(Continued)

FOREIGN PATENT DOCUMENTS

KR          10-0666171 B1     1/2007

*Primary Examiner* — Amir Zarabian
*Assistant Examiner* — Bradley S Coon
(74) *Attorney, Agent, or Firm* — Muir Patent Law, PLLC

(57)          ABSTRACT

A memory device according to an embodiment includes a memory cell array including a plurality of memory cells, a control logic configured to control a verification operation for the plurality of memory cells, a page buffer block including a plurality of page buffers connected to the memory cell array through bit lines, a page buffer decoder that outputs, through an output line. a verification signal generated from at least one of outputs of the plurality of page buffers by a verification operation, and a verification error removal circuit connected to the output line and configured to control an output path of the verification signal to the control logic.

20 Claims, 17 Drawing Sheets

(56)                    References Cited

U.S. PATENT DOCUMENTS

| | | | |
|---|---|---|---|
| 2019/0108884 A1* | 4/2019 | Kato | G11C 8/08 |
| 2019/0237153 A1* | 8/2019 | Hong | G11C 16/0408 |
| 2021/0193227 A1* | 6/2021 | Kim | G11C 29/52 |
| 2022/0068322 A1 | 3/2022 | Cho et al. | |
| 2022/0100622 A1* | 3/2022 | Park | G11C 29/81 |
| 2022/0101931 A1* | 3/2022 | Yun | G11C 29/028 |

* cited by examiner

[1st Section]

[2nd Section]

FIG. 8A

——— : LATCH SETTING PATH

– – – : OUTPUT PATH

| STATE | VERIFICATION SIGNAL | PATH CONTROL SIGNAL | WHETHER INCLUDE COUNT |
|---|---|---|---|
| DEFECTIVE STATE | H/L (FIRST DEFECTIVE STATE) | L/H | EXCLUDE |
| | L (SECOND DEFECTIVE STATE) | H | EXCLUDE |
| | H (THIRD DEFECTIVE STATE) | L | EXCLUDE |
| NORMAL STATE | H/L | L/H | INCLUDE |

FIG. 11

PAGE BUFFER BLOCK AND MEMORY DEVICE INCLUDING THE SAME

CROSS-REFERENCE TO RELATED APPLICATION

This application is based on and claims priority under 35 U.S.C. § 119 to Korean Patent Application No. 10-2023-0009542, filed on Jan. 25, 2023, in the Korean Intellectual Property Office, the disclosure of which is incorporated by reference herein in its entirety.

BACKGROUND

Aspects of the inventive concept relate to a memory device, and more particularly, to a page buffer block for performing a verification operation by counting the number of off-cells according to a memory operation, and a memory device including the page buffer block.

A semiconductor memory device is a memory device implemented by using a semiconductor, such as silicon (Si), germanium (Ge), gallium arsenide (GaAs), or indium phosphide (InP). Semiconductor memory devices may be largely classified into volatile memory devices and nonvolatile memory devices.

In particular, nonvolatile memory devices such as flash memory devices are used in various fields due to their advantages such as fast operating speed, low power consumption, low noise, and high capacity. The nonvolatile memory device may count off-cells (or on-cells) among memory cells by using a predetermined verification voltage to determine a program state of the memory cells. Through the counted number of off-cells, the shape of distribution of threshold voltages of memory cells, characteristics of memory cells, etc. are identified, and based on the identification, the nonvolatile memory device may perform memory operations such as program and read.

In addition, in a specific memory operation, it is necessary to accurately identify the distribution of threshold voltages of memory cells and the characteristics of memory cells. To this end, research on a nonvolatile memory device capable of accurately counting the number of off-cells is being conducted.

SUMMARY

Aspects of the inventive concept provide a page buffer block for performing an accurate verification operation by preventing a verification signal generated through defective circuits or lines from being reflected in a count operation of off-cells, and a memory device including the page buffer block.

According to an aspect of the inventive concept, there is provided a memory device including a memory cell array including a plurality of memory cells, a control logic configured to control a verification operation for the plurality of memory cells, and a page buffer block including a plurality of page buffers connected to the memory cell array through bit lines, a page buffer decoder that outputs a verification signal generated from at least one of outputs of the plurality of page buffers by a verification operation through an output line, a verification error removal circuit connected to the output line and configured to control an output path of the verification signal to the control logic, wherein the verification error removal circuit includes a first latch configured to store state information indicating whether at least one bit line or at least one page buffer related to the verification signal is defective, and is configured to control the output path based on an output of the first latch and a path control signal generated from the verification signal.

According to an aspect of the inventive concept, there is provided a page buffer block including a plurality of page buffers connected to a memory cell array through bit lines, a page buffer decoder configured to output, through an output line, a verification signal generated by selecting at least one output from the plurality of page buffers, and a verification error removal circuit connected to the output line and configured to control enable or disable of an output path of the verification signal, wherein the verification error removal circuit configured to control the output path based on state information indicating whether at least one bit line or at least one page buffer related to the verification signal is defective and a path control signal generated from the verification signal.

BRIEF DESCRIPTION OF THE DRAWINGS

Embodiments will be more clearly understood from the following detailed description taken in conjunction with the accompanying drawings in which:

FIGS. 8A to 8C are diagrams for explaining the operation of the verification error removal circuit of FIG. 7;

FIG. 11 is a diagram for explaining an implementation example of a verification error removal circuit according to an embodiment;

DETAILED DESCRIPTION OF THE EMBODIMENTS

Figure 1:
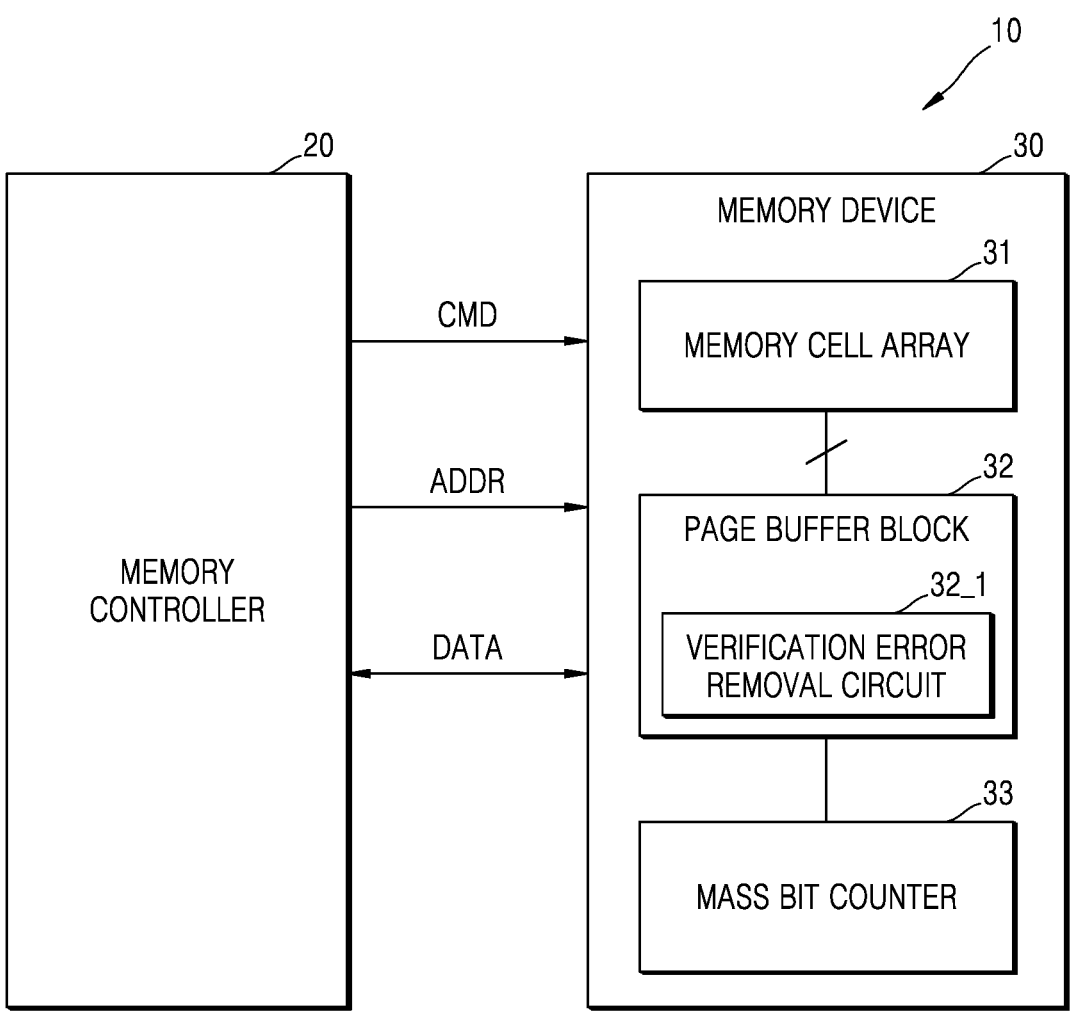
FIG. 1 is a schematic block diagram of a memory system according to an embodiment.

FIG. 1 is a schematic block diagram of a memory system 10 according to an embodiment.

Referring to FIG. 1, the memory system 10 may include a memory controller 20 and a memory device 30. As an embodiment, the memory system 10 may be implemented as a single chip, a single semiconductor package, or a single module. In some embodiments, each of the memory controller 20 and the memory device 30 may be implemented as one chip, one semiconductor package, or one module. The memory system 10 may be used as a storage medium of an external device (e.g., a host, an application processor, etc.). The memory system 10 may be a mass storage medium, such as a memory card, a memory stick, or a solid state drive (SSD).

The memory controller 20 may control the memory device 30 according to the control of an external device. The memory controller 20 may transmit an address ADDR and a command CMD to the memory device 30 or may transmit and receive data DATA to and from the memory device 30.

The memory device 30 may include a memory cell array 31, a page buffer block 32 and a mass bit counter 33. The memory cell array 31 may include a plurality of memory cells. As an embodiment, the memory cell array 31 may be a NAND flash memory cell array or a NOR flash memory cell array. Hereinafter, embodiments according to aspects of the inventive concept will be described in detail assuming that the plurality of memory cells are NAND flash memory cells. However, aspects of the present inventive concept are not limited thereto, and in another embodiment, the plurality of memory cells are resistive memory cells, such as resistive RAM (RRAM), phase change RAM (PRAM), or magnetic RAM (MRAM), or, furthermore, may also be a volatile memory cell, such as Dynamic RAM (DRAM).

The page buffer block 32 may include a plurality of page buffers (not shown) connected to the memory cell array 31 through a plurality of bit lines. After a program operation is performed on memory cells of the memory cell array 31, a predetermined verification voltage (or a read voltage) is applied to the memory cell array 31, and the page buffer block 32 may receive at least one output based on the verification voltage from the memory cell array 31 through at least one bit line. The page buffer block 32 may transmit a verification signal generated from the at least one received output to the mass bit counter 33.

As an embodiment, the page buffer block 32 may include a verification error removal circuit 32_1. The verification signal generated by the page buffer block 32 may include an error due to a defect of at least one bit line or at least one page buffer associated with the verification signal. Meanwhile, the verification signal generated by the page buffer block 32 may include an error due to a defect in an output line that transfers the verification signal. In the present specification, the output line may be connected to a sensing node between the memory cell array 31 and the page buffer block 32 and may be used to store state information in a first latch included in the verification error removal circuit 32_1. Details of the output line is described later.

As an embodiment, when the verification signal includes an error, the verification error removal circuit 32_1 may control an output path of the verification signal from the page buffer block 32 to the mass bit counter 33 so that the verification signal including an error is not used in the operation of the mass bit counter 33. In the present specification, the output path of the verification signal is described based on the path formed between the page buffer block 32 and the mass bit counter 33, but this is only an example and is not limited thereto, and the output path may be defined in various ways. In addition, in the present specification, an operation of controlling the output path of the verification signal may include an operation of disabling the output path so that the verification signal is not provided to the mass bit counter 33 or an operation of enabling the output path so that the verification signal is provided to the mass bit counter 33. Therefore, the operation of controlling the output path of the verification signal may be understood as an operation of providing or not providing the verification signal to the mass bit counter 33.

Specifically, the verification error removal circuit 32_1 may control an output path of the verification signal not to be used in the operation of the mass bit counter 33 for the verification signal including not only an error due to defect of at least one bit line or at least one page buffer associated with the verification signal but also an error caused by defects in the output line that delivers the verification signal.

As an embodiment, the verification error removal circuit 32_1 may control the output path of the verification signal based on state information indicating whether at least one bit line or at least one page buffer associated with the verification signal is defective and a path control signal generated from the verification signal.

The mass bit counter 33 may perform an operation of counting the number of off-cells based on the verification signal received from the page buffer block 32. In the present specification, the operation of counting the number of off-cells may be referred to as a mass bit counting operation. The memory device 30 may perform a verification with respect to a program operation performed on the memory cell array 31 based on a counting result of the mass bit counter 33.

The memory device 30 according to an embodiment may support an accurate mass bit counting operation by controlling a verification signal including an error so as not to be used for the mass bit counting operation, and as a result, accurate verification of the program operation is possible, and thereby the reliability of a program operation of the memory device 30 may be improved.

Figure 2:
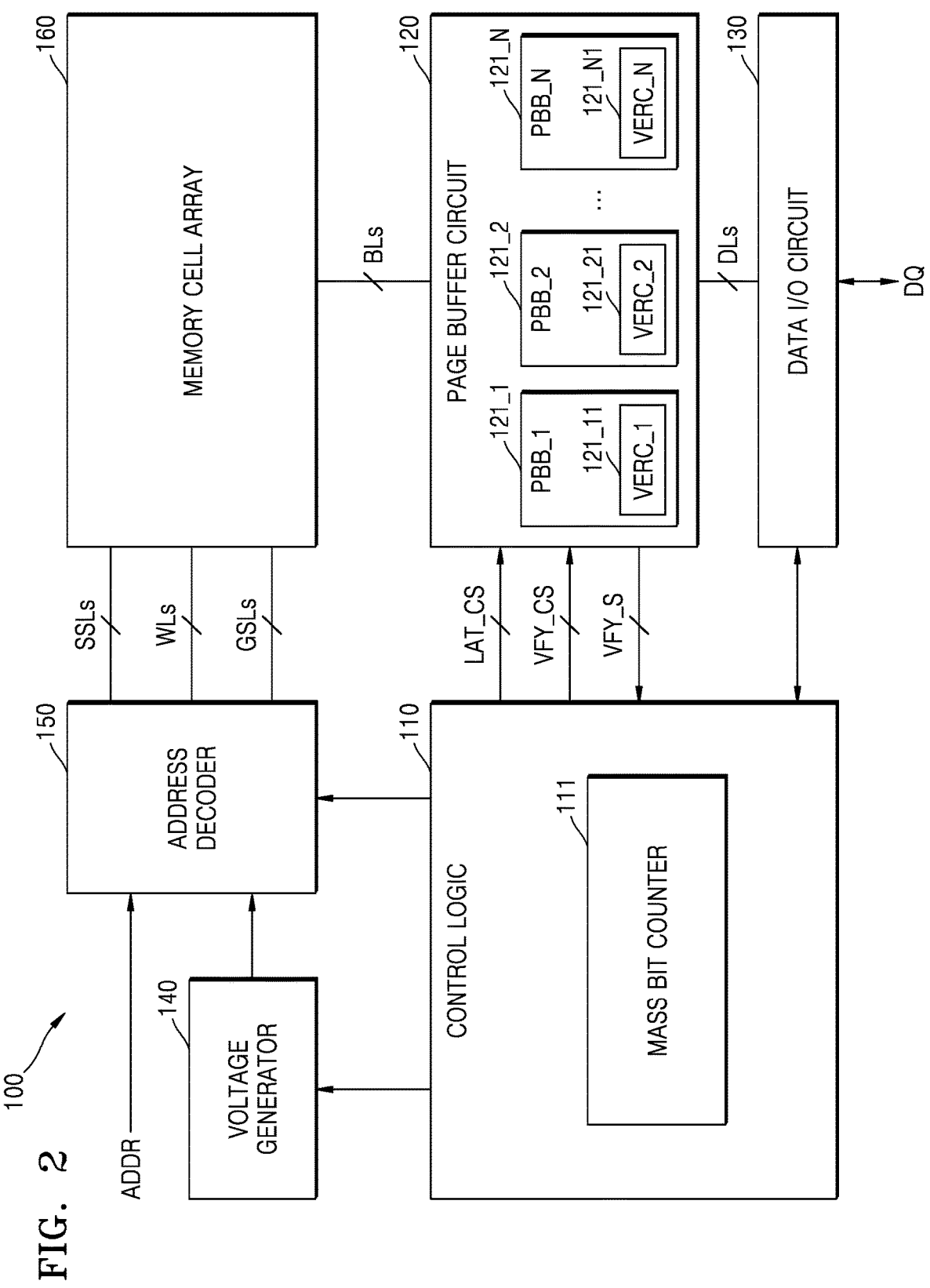
FIG. 2 is a block diagram illustrating an implementation example of a memory device of the memory system of FIG. 1.

FIG. 2 is a block diagram illustrating an implementation example of the memory device 100 of the memory system 10 of FIG. 1.

Referring to FIG. 2, the memory device 100 includes a control logic 110, a page buffer circuit 120, a data input/output circuit 130, a voltage generator 140, an address decoder 150, and a memory cell array 160.

The memory cell array 160 is connected to the address decoder 150 through word lines WLs, string select lines SSLs, and ground select lines GSLs and may be connected to the page buffer circuit 120 through bit lines BLs. The memory cell array 160 may include a plurality of memory blocks. The memory cell array 160 may include a plurality of NAND cell strings. Each of the cell strings may form a channel in a vertical direction or a horizontal direction. The word lines WLs may be vertically stacked in the memory cell array 160.

The address decoder 150 may select one of the word lines WLs of the memory cell array 160 by decoding an address ADDR. The address decoder 150 may apply a program voltage provided from the voltage generator 140 to the selected word line of the memory cell array 160 during a program operation. Also, the address decoder 150 may apply a verification voltage or a read voltage provided from the voltage generator 140 to the selected word line of the memory cell array 160 during a verification operation or a read operation.

The data input/output circuit 130 may be connected to the page buffer circuit 120 through data lines DLs, and provide input data DQ to the page buffer circuit 120 or provide data DQ provided from the page buffer circuit 120 to the outside (i.e., external to the memory device 100). The data input/output circuit 130 may provide an input command or address to the control logic 110 or the address decoder 150.

The page buffer circuit 120 may operate as a program driver or a sense amplifier according to an operation performed by the control logic 110. During a program operation, the page buffer circuit 120 may provide a voltage corresponding to data to be programmed to the bit lines BLs of the memory cell array 160. During a verification operation or a read operation, the page buffer circuit 120 may sense data programmed into a selected memory cell through the bit lines BLs and provide the data to the control logic 110 or the data input/output circuit 130.

The control logic 110 may include a mass bit counter 111. The control logic 110 may perform verification of the program operation performed on the memory cell array 160 using the page buffer circuit 120, and at this time, the mass bit counter 111 may generate a verification control signal VFY_CS and provide the verification control signal VFY_CS to the page buffer circuit 120. The page buffer circuit 120 may receive outputs from the memory cell array 160 based on the verification control signal VFY_CS, generate verification signals VFY_S, and provide the generated verification signals VFY_S to the mass bit counter 111. The mass bit counter 111 may count the number of off-cells using the verification signals VFY_S.

As an embodiment, the page buffer circuit 120 may include first to N$^{th}$ page buffer blocks (PBBs) 121_1 to 121_N. The first to N$^{th}$ page buffer blocks 121_1 to 121_N may include first to N$^{th}$ verification error removal circuits (VERCs) 121_11 to 121_N1, respectively.

As an embodiment, each of the first to N$^{th}$ page buffer blocks 121_1 to 121_N may be connected to different bit lines from each other and may provide one verification signal to the control logic 110.

As an embodiment, the first verification error removal circuit 121_11 may include first latch for storing state information that indicates whether at least one bit line or at least one page buffer associated with a verification signal provided by the first page buffer block 121_1 is defective. In some embodiments, the first verification error removal circuit 121_11 may further include a second latch that temporarily stores state information before the state information is stored in the first latch. The first verification error removal circuit 121_11 may store state information in the first latch based on a latch control signal LAT_CS provided from the control logic 110. Meanwhile, an output line for transferring a verification signal may be used to transfer state information to the first latch.

In an embodiment, the first verification error removal circuit 121_11 may control an output path of a verification signal formed between the first page buffer block 121_1 and the control logic 110 (or the mass bit counter 111) based on a path control signal generated from the output of the first latch and the verification signal. Through this, the first verification error removal circuit 121_11 may prevent a verification signal including an error due to a defect in an output line transferring state information from being used for the mass bit count operation.

Meanwhile, it will be sufficiently understood that the above-described embodiments of the first verification error removal circuit 121_11 are also applied to the remaining verification error removal circuits 121_21 to 121_N1.

Figure 3A:
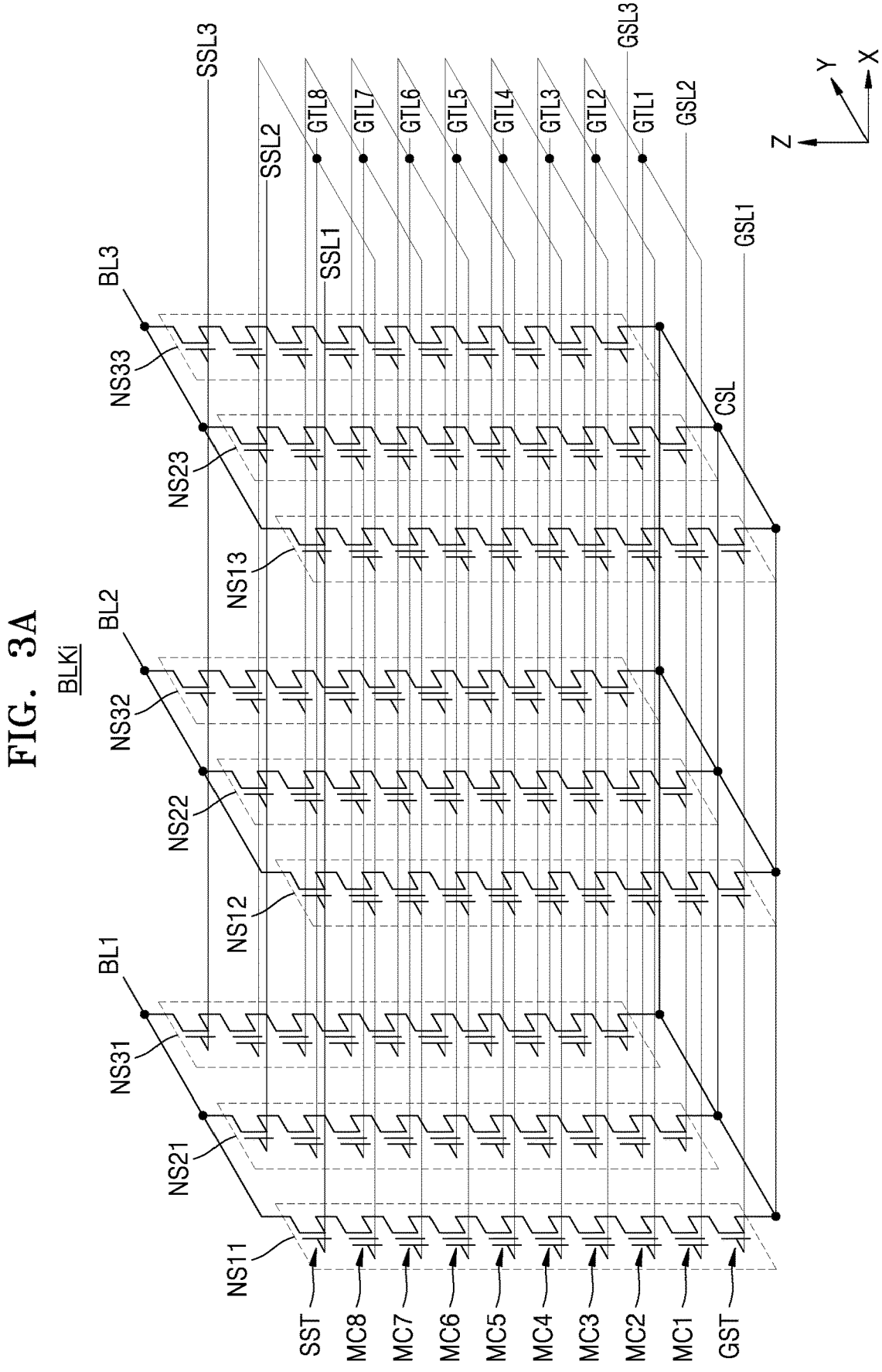
FIGS. 3A to 3C are diagrams for explaining a 3D V-NAND structure applicable to the memory device of FIG. 1.
Figure 3B:
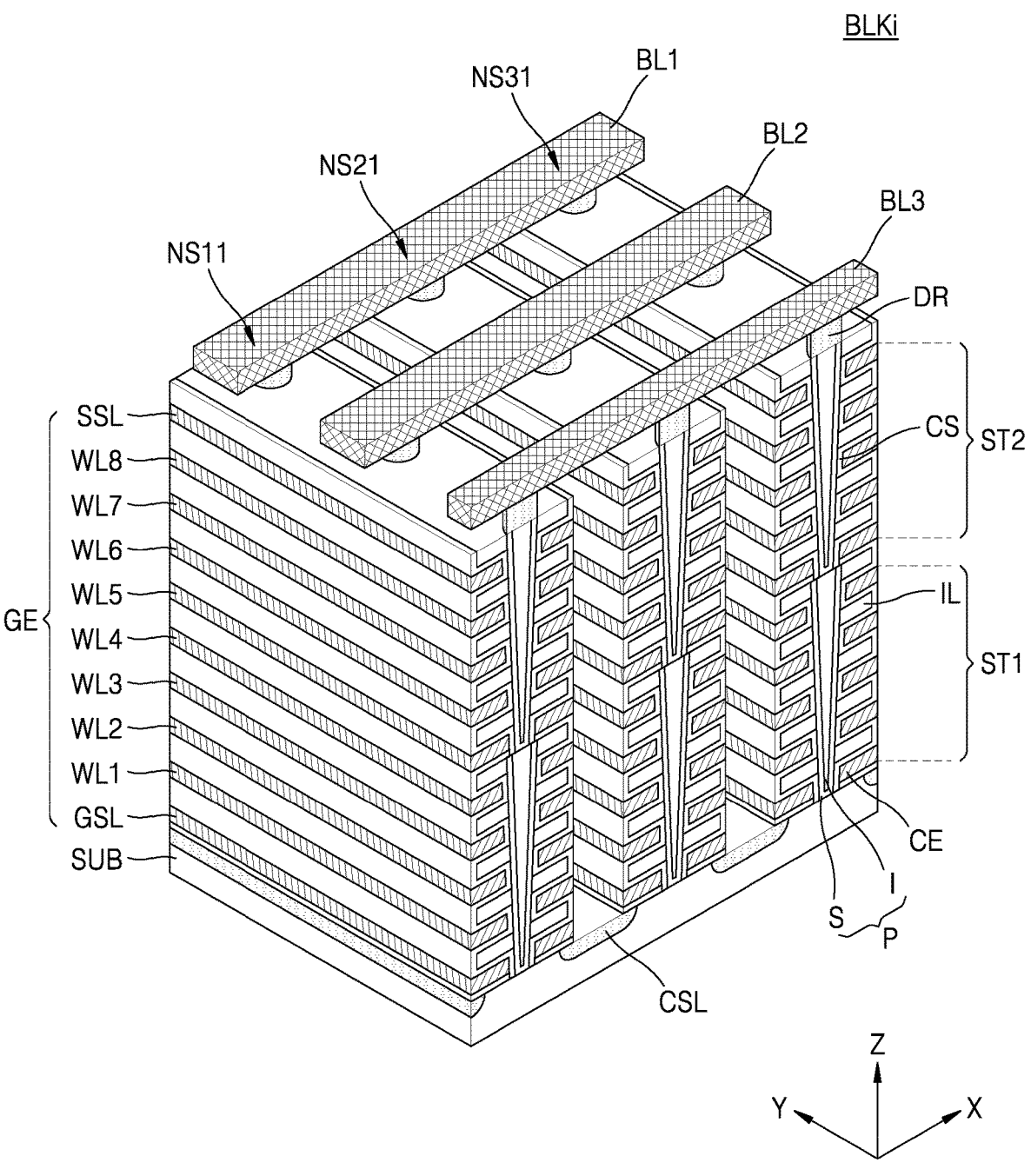
Figure 3C:
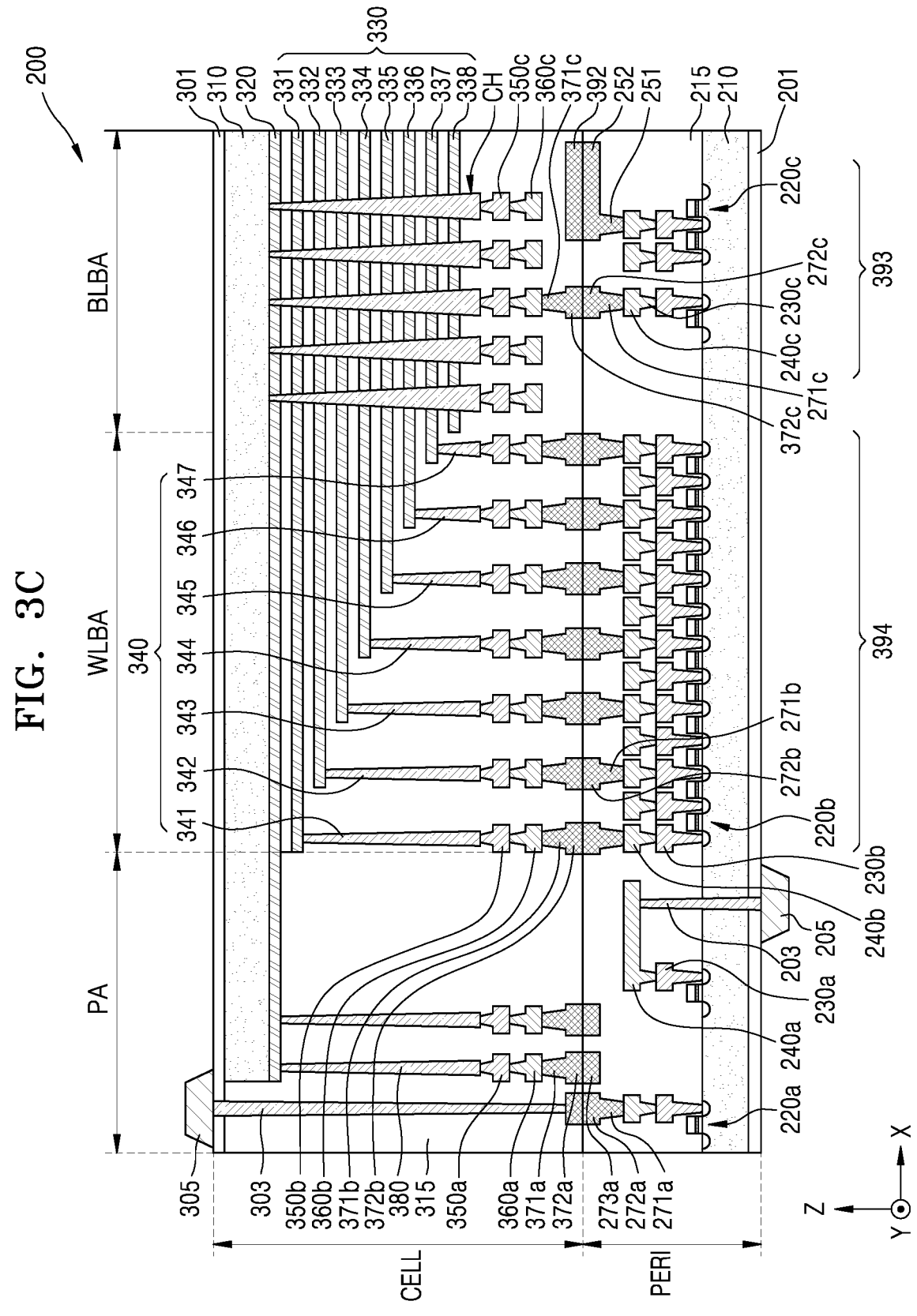

FIGS. 3A to 3C are diagrams for explaining a 3D V-NAND structure applicable to the memory device 30 of FIG. 1. The memory cell array 31 (refer to FIG. 1) of memory device 30 (refer to FIG. 1) may include a plurality of memory blocks. FIGS. 3A and 3B illustrate the structure of one memory block BLKi among a plurality of memory blocks, and FIG. 3C describes an implementation example of the structure of the memory device 30 of FIG. 1.

Referring to FIG. 3A, the memory block BLKi may include a plurality of memory NAND strings NS11 to NS33 connected between the bit lines BL1, BL2, and BL3 and a common source line CSL. Each of the plurality of memory NAND strings NS11 to NS33 may include a string select transistor SST, a plurality of memory cells MC1 to MC8, and a ground select transistor GST. For simplicity of the drawing, FIG. 3A shows that each of the plurality of memory NAND strings NS11 to NS33 includes eight memory cells MC1 to MC8, but is not necessarily limited thereto.

The string select transistor SST may be connected to corresponding string select lines SSL1, SSL2, and SSL3. The plurality of memory cells MC1 to MC8 may be connected to corresponding gate lines GTL1 to GTL8, respectively. The gate lines GTL1 to GTL8 may correspond to word lines, and some of the gate lines GTL1 to GTL8 may correspond to dummy word lines. The ground select transistor GST may be connected to corresponding ground select lines GSL1, GSL2, and GSL3. The string select transistor SST may be connected to corresponding bit lines BL1, BL2, and BL3, and the ground select transistor GST may be connected to the common source line CSL.

The gate lines (e.g., GTL1) having the same height may be connected in common, and the ground select lines GSL1, GSL2, and GSL3 and string select lines SSL1, SSL2, and SSL3 may be separated from each other. In FIG. 3, although the memory block BLK is illustrated as being connected to eight gate lines GTL1 to GTL8 and three bit lines BL1, BL2, and BL3, it is not limited thereto.

Further referring to FIG. 3B, the memory block BLKi is formed in a direction perpendicular to a substrate SUB. Memory cells constituting the memory NAND strings NS11 to NS33 are formed by stacking a plurality of semiconductor layers.

The common source line CSL extending in a first direction (Y direction) is provided on the substrate SUB. On a region of the substrate SUB between two adjacent common source lines CSL, a plurality of insulating films IL extending in the first direction (Y direction) are sequentially provided in a third direction (Z direction), and the plurality of insulating layers IL may be spaced apart by a specific distance in the third direction (Z direction). On the region of the substrate SUB between two adjacent common source lines CSL, a plurality of pillars P are provided by being sequentially disposed in the first direction (Y direction) and penetrating the plurality of insulating layers IL in the third direction (Z direction). The plurality of pillars P may contact the substrate SUB by penetrating the plurality of insulating layers IL. A surface layer S of each pillar P may include a silicon material doped with a first conductivity type, and may function as a channel region.

An inner layer I of each pillar P may include an insulating material, such as silicon oxide or an air gap. In a region between two adjacent common source lines CSL, a charge storage layer CS is provided along exposed surfaces of the insulating layers IL, the pillars P, and the substrate SUB. The charge storage layer CS may include a gate insulating layer (or referred to as 'tunneling insulating layer'), a charge trap layer, and a blocking insulating layer. In addition, in a region between two adjacent common source lines CSL, on the exposed surface of the charge storage layer CS, gate electrode GE, such as select lines GSL and SSL and word lines WL1 to WL8 is provided. Drains or drain contacts DR may be provided on the plurality of pillars P, respectively. Bit lines BL1 to BL3 extending in a second direction (X direction) and spaced apart from each other by a specific distance in the first direction (Y direction) may be provided on the drain contacts DR.

As shown in FIG. 3B, each of the memory NAND strings NS11 to NS33 may be implemented in a structure in which a first memory stack ST1 and a second memory stack ST2 are stacked. The first memory stack ST1 is connected to the common source line CSL, the second memory stack ST2 is connected to the bit lines BL1 to BL3, and the first memory stack ST1 and the second memory stack ST2 are stacked to share a channel hole with each other.

Further referring to FIG. 3C, a memory device 200 may have a chip to chip (C2C) structure. The C2C structure may denote that, after forming an upper chip including a cell region CELL on a first wafer and a lower chip including a peripheral circuit region PERI on a second wafer different from the first wafer, and then the upper chip is connected to the lower chip by using a bonding method. For example, the bonding method may refer to a method of electrically connecting a bonding metal formed on the uppermost metal layer of the upper chip and a bonding metal formed on the uppermost metal layer of the lower chip to each other. For example, when the bonding metal includes copper (Cu), the bonding method may be a Cu—Cu bonding method, and the bonding metal may also include aluminum (Al) or tungsten (W).

Each of the peripheral circuit region PERI and the cell region CELL of the memory device 200 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c and second metal layers 240a, 240b, and 240c formed on the first metal layers 230a, 230b, and 230c. In one embodiment, the first metal layers 230a, 230b, and 230c may include tungsten having a relatively high electrical specific resistance, and the second metal layers 240a, 240b, and 240c may include copper having a relatively low electrical specific resistance.

In the present specification, only the first metal layers 230a, 230b, and 230c and the second metal layers 240a, 240b, and 240c are illustrated and described, but the present specification is not limited thereto, and at least one or more metal layers may further be formed on the second metal layers 240a, 240b, and 240c. Some of the at least one or more metal layers formed on the second metal layers 240a, 240b, and 240c may include aluminum having a lower electrical specific resistance than copper forming the second metal layers 240a, 240b, and 240c.

The interlayer insulating layer 215 may be disposed on the substrate 210 to cover the plurality of circuit elements 220a, 220b, and 220c, the first metal layers 230a, 230b, and 230c, and the second metal layers 240a, 240b, and 240c, and may include an insulating material, such as silicon oxide or silicon nitride.

Lower bonding metals 271b and 272b may be formed on the second metal layer 240b of the word line bonding region WLBA. In the word line bonding region WLBA, the lower bonding metals 271b and 272b of the peripheral circuit region PERI may be electrically connected to upper bonding metals 371b and 372b of the cell region CELL by a bonding method, and the lower bonding metals 271b and 272b and the upper bonding metals 371b and 372b may include aluminum, copper, or tungsten.

The cell region CELL may provide at least one memory block. The cell region CELL may include a second substrate 310 and the common source line 320. A plurality of word lines 331 to 338 (330) may be stacked on the second substrate 310 in a direction (Z-axis direction) perpendicular to an upper surface of the second substrate 310. String select lines and a ground select line may be disposed on upper and lower portions of the word lines 330, and a plurality of word lines 330 may be disposed between the string select lines and the ground select line.

In the bit line bonding region BLBA, a channel structure CH extends in a direction (Z-axis direction) perpendicular to an upper surface of the second substrate 310 to pass through the word lines 330, the string selection lines, and the ground selection. The channel structure CH may include a data storage layer, a channel layer, and a buried insulating layer, and the channel layer may be electrically connected to a first metal layer 350c and a second metal layer 360c. For example, the first metal layer 350c may be a bit line contact, and the second metal layer 360c may be a bit line. In one embodiment, the bit line 360c may extend in the first direction (Y-axis direction) parallel to the upper surface of the second substrate 310.

A region where the channel structure CH and the bit line 360c are disposed may be defined as a bit line bonding region BLBA. The bit line 360c may be electrically connected to the circuit elements 220c that provide a page buffer 393 in the peripheral circuit region PERI in the bit line bonding region BLBA. For example, in the peripheral circuit region PERI, the bit line 360c may be connected to upper bonding metals 371c and 372c, and the upper bonding metals 371c and 372c may be connected to the lower bonding metals 271c and 272c connected to the circuit elements 220c of a page buffer 393.

In the word line bonding region WLBA, the word lines 330 may extend in a second direction (X-axis direction) perpendicular to the first direction and parallel to the upper surface of the second substrate 310, and may be connected to a plurality of cell contact plugs 341 to 347 (340). The word lines 330 and the cell contact plugs 340 may be connected to each other through pads provided by extending at least some of the word lines 330 with different lengths in the second direction. A first metal layer 350b and a second metal layer 360b may be sequentially connected to upper portions of the cell contact plugs 340 connected to the word lines 330. The cell contact plugs 340 may be connected to the peripheral circuit region PERI through the upper bonding metals 371b and 372b of the cell region CELL and the lower bonding metals 271b and 272b of the peripheral circuit region PERI in the word line bonding region WLBA.

The cell contact plugs 340 may be electrically connected to the circuit elements 220b providing a row decoder 394 in the peripheral circuit region PERI. In one embodiment, an operating voltage of the circuit elements 220b forming the row decoder 394 may be different from an operating voltage of the circuit elements 220c forming the page buffer 393. For example, an operating voltage of the circuit elements 220c forming the page buffer 393 may be higher than an operating voltage of the circuit elements 220b forming the row decoder 394.

A common source line contact plug 380 may be disposed in the external pad bonding region PA. The common source line contact plug 380 may include a conductive material, such as metal, a metal compound, or polysilicon, and may be electrically connected to a common source line 320. A first metal layer 350a and a second metal layer 360a may be sequentially stacked on the common source line contact plug 380. As an example, a region where the common source line contact plug 380, the first metal layer 350a, and the second metal layer 360a are disposed may be defined as the external pad bonding region PA.

Meanwhile, input/output pads 205 and 305 may be disposed in the external pad bonding region PA. A lower insulating film 201 covering a lower surface of the first substrate 210 may be formed under the first substrate 210, and a first input/output pad 205 may be formed on the lower insulating film 201. The first input/output pad 205 may be connected to at least one of the plurality of circuit elements 220a, 220b, and 220c disposed in the peripheral circuit region PERI through the first input/output contact plug 203, and may be separated from the first substrate 210 by the lower insulating film 201. In addition, a side insulating layer is disposed between the first input/output contact plug 203 and the first substrate 210 to electrically separate the first input/output contact plug 203 from the first substrate 210.

An upper insulating film 301 covering the upper surface of the second substrate 310 may be formed on the second substrate 310, and a second input/output pad 305 may be disposed on the upper insulating film 301. The second input/output pad 305 may be connected to at least one of the plurality of circuit elements 220a, 220b, and 220c disposed in the peripheral circuit region PERI through a second input/output contact plug 303. In one embodiment, the second input/output pad 305 may be electrically connected to the circuit element 220a.

According to embodiments, the second substrate 310 and the common source line 320 may not be disposed in a region where the second input/output contact plug 303 is disposed. Also, the second input/output pad 305 may not overlap the word lines 330 in the third direction (Z-axis direction). The second input/output contact plug 303 is separated from the second substrate 310 in a direction parallel to the upper surface of the second substrate 310, and may be connected to the second input/output pad 305 through an interlayer insulating layer 315 of the cell region CELL.

According to embodiments, the first input/output pad 205 and the second input/output pad 305 may be selectively formed. For example, the memory device 200 may include only the first input/output pad 205 disposed on the first substrate 210 or the second input/output pad 305 disposed on the second substrate 310. Alternatively, the memory device 200 may include both the first input/output pad 205 and the second input/output pad 305.

In each of the external pad bonding region PA and the bit line bonding region BLBA included in the cell region CELL and the peripheral circuit region PERI, a metal pattern of the uppermost metal layer may exist as a dummy pattern, or the uppermost metal layer may be empty.

In the memory device 200, a lower metal pattern 273a having the same shape as an upper metal pattern 372a of the cell region CELL may be formed on the uppermost metal layer of the peripheral circuit region PERI corresponding to the upper metal pattern 372a formed on the uppermost metal layer of the cell region CELL in the external pad bonding area PA. The lower metal pattern 273a formed on the uppermost metal layer of the peripheral circuit region PERI may not be connected to a separate contact in the peripheral circuit region PERI. Similarly, in the external pad bonding region PA, an upper metal pattern 373a having the same shape as the lower metal pattern 273a of the peripheral circuit region PERI may be formed on the upper metal layer of the cell area CELL corresponding to the lower metal pattern 273a formed on the uppermost metal layer of the peripheral circuit area PERI.

The lower bonding metals 271b and 272b may be formed on the second metal layer 240b of the word line bonding region WLBA. In the word line bonding region WLBA, the lower bonding metals 271b and 272b of the peripheral circuit region PERI may be electrically connected to the upper bonding metals 371b and 372b of the cell region CELL by using a bonding method.

In addition, in the bit line bonding region BLBA, an upper metal pattern 392 having the same shape as the metal pattern 252 of the peripheral circuit region PERI may be formed on the uppermost metal layer of the cell region CELL corresponding to the lower metal pattern 252 formed on the uppermost metal layer of the peripheral circuit area PERI. A contact may not be formed on the upper metal pattern 392 formed on the uppermost metal layer of the cell region CELL.

Figure 4:
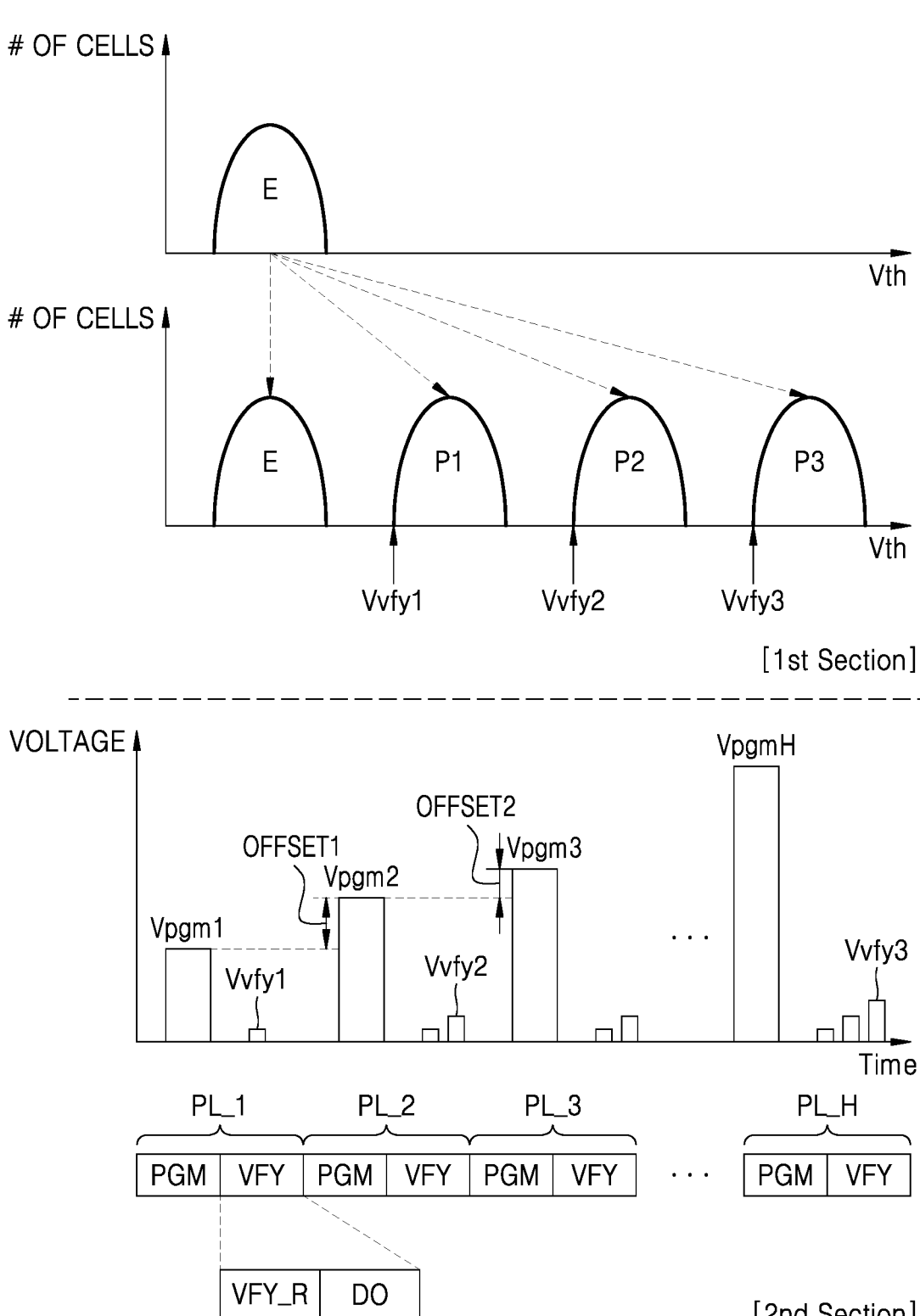
FIG. 4 is a diagram for describing a program operation of memory cells according to an embodiment.

FIG. 4 is a diagram for describing a program operation of memory cells according to an embodiment.

In FIG. 4, for convenience of description, it is assumed that the memory cell is a multi-level cell, and the description below may be applied to a single level cell, a triple level cell, or a quadruple level cell, etc.

Referring to FIG. 4, as shown in a first section, memory cells of a memory cell array may have an erase state E and any one of first to third program states P1 to P3. For example, the memory cells may be in an erased state E as an initial state, and, as a result of performing programming on the memory cells, the memory cells may have the erase state E and any one of the first to third program states P1 to P3.

As shown in a second section, a memory device may program memory cells based on an incremental step pulse programming (ISPP) method. The memory device may program memory cells by performing a plurality of program loops PL_1 to PL_H. Each of the program loops PL_1 to PL_H may include a program operation PGM for applying program voltages Vpgm1 to VpgmH to select word lines and a verification operation VFY for verifying programmed states of memory cells. Whenever the program loops PL_1 to PL_H are sequentially performed, the program voltage applied to the select word line in the program phase PGM may increase by as much as an offset voltage OFFSET. For example, a difference between the program voltage Vpgm1 of the first program loop PL_1 and the program voltage Vpgm2 of the second program loop PL_2 may be a first offset voltage OFFSET1, and a difference between the program voltage Vpgm2 of the second program loop PL_2 and the program voltage Vpgm3 of the third program loop PL_3 may be a second offset voltage OFFSET2. The first offset voltage OFFSET1 and the second offset voltage OFFSET2 may be identically or differently controlled by the memory device.

The verification operation VFY may include a verification read operation VFY_R and a determination operation DO. The verification read operation VFY_R refers to an operation of reading memory cells based on first to third verification voltages Vvfy1 to Vvfy3. For example, memory cells in which a target program state is a first program state P1 may be read by the first verification voltage Vvfy1. A memory cell in which the target program state is the first program state P1 and is programmed in the first program state P1 may be read as an off-cell by the first verification voltage Vvfy1, and a memory cell in which the target program state is the first program state P1 and has not yet been programmed to the first program state P1 may be read as an on-cell by the first verification voltage Vvfy1. As described above, with respect to memory cells in which the target program state is a second program state P2 or a third program state P3, the verification read operation VFY_R may be performed as described above using the second verification voltage Vvfy2 or the third verification voltage Vvfy3.

In the present specification, although the mass bit counter according to an embodiment is generally described as counting the number of off-cells, this is for convenience of description and is not limited thereto, and the mass bit counter may count the number of on-cells, and based on the counting result, a memory operation may be performed. In addition, it is obvious that the spirit of the inventive concept may be applied to all embodiments of the counting of the number of off-cells and the counting of the number of on-cells.

After the verification read operation VFY_R is performed, the determination operation DO may be performed, and the determination operation DO may include an operation of determining pass/fail for program operation PGM of a program loop, and furthermore, the determination operation DO may include an operation of determining a distribution tendency of threshold voltages formed by memory cells by the program operation PGM, characteristics related to fast cells and slow cells of memory cells, and the like. The determination operation DO may be performed using the number of off-cells generated in the verification read operation VFY_R.

Figure 5:
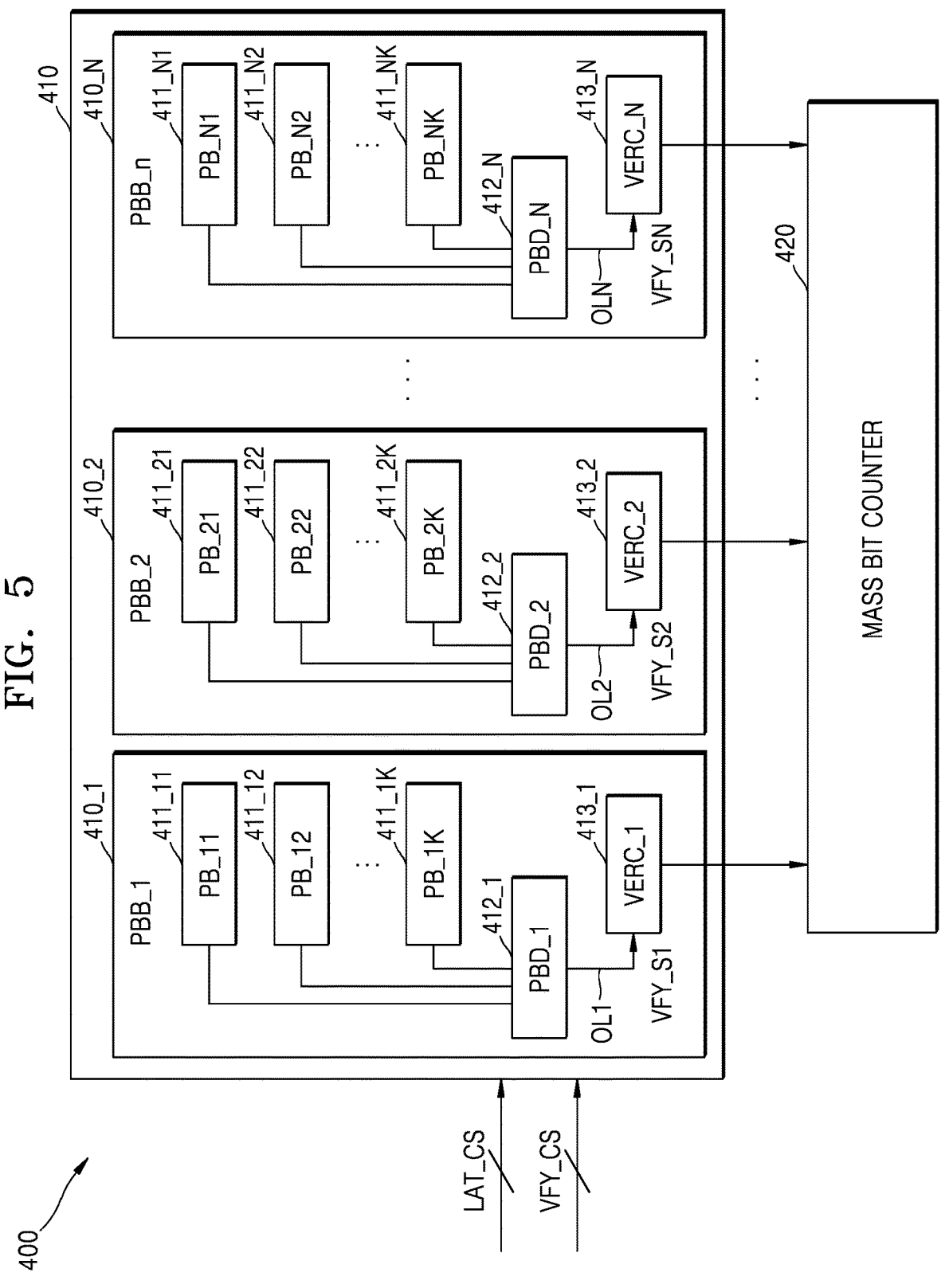
FIG. 5 is a block diagram of a memory device according to an embodiment.

FIG. 5 is a block diagram of a memory device 400 according to an embodiment.

In FIG. 5, for convenience of description, only a page buffer circuit 410 and a mass bit counter 420 are illustrated as a configuration of the memory device 400, and embodiments of the inventive concept are not limited thereto.

Referring to FIG. 5, the page buffer circuit 410 may include first to $N^{th}$ page buffer blocks 410_1 to 410_N. The first to $N^{th}$ page buffer blocks 410_1 to 410_N may sequentially or simultaneously transmit first to $N^{th}$ verification signals VFY_S1 to VFY_SN to the mass bit counter 420. The mass bit counter 420 may count the number of off-cells based on the first to $N^{th}$ verification signals VFY_S1 to VFY_SN. Hereinafter, an embodiment of a first page buffer block 410_1 is mainly described, and it will be sufficiently understood that the described embodiment is applied to the remaining page buffer blocks 410_2 to 410_N.

As an embodiment, the first page buffer block 410_1 may include first to $K^{th}$ page buffers 411_11 to 411_1K, a page buffer decoder 412_1, and a verification error removal circuit 413_1. As an embodiment, the verification error removal circuit 413_1 may include a first latch (not shown) for storing state information indicating whether bit lines connected to the first to $K^{th}$ page buffers 411_11 to 411_1K or the first to $K^{th}$ page buffers 411_11 to 411_1K are defective. As an embodiment, the verification error removal circuit 413_1 may store state information related to the first verification signal VFY_S1 in the first latch based on a latch control signal LAT_CS. In the present specification, a bit line or page buffer related to a verification signal may be understood as a bit line or page buffer used for transmission or generation of a verification signal. Meanwhile, state information may be stored in the first latch through a first output line OL1.

The first to $K^{th}$ page buffers 411_11 to 411_1K may be connected to the page buffer decoder 412_1, and the page buffer decoder 412_1 may select at least one of the outputs of the first to $K^{th}$ page buffers 411_11 to 411_1K based on a verification control signal VFY_CS and may output the selected output, as a first verification signal VFY_S1, to the verification error removal circuit 413_1 through the first output line OL1.

As an embodiment, the verification error removal circuit 413_1 may control an output path of the first verification signal VFY_S1 based on a path control signal generated from the output of the first latch and the first verification signal VFY_S1. For example, the verification error removal circuit 413_1 may determine whether an error due to a defect of at least one bit line or at least one page buffer related to the first verification signal VFY_S1 is included in the first verification signal VFY_S1 based on the output of the first latch, and may determine whether an error due to a defect of the first output line OL1 is included in the first verification signal VFY_S1 based on the path control signal. A specific embodiment of this verification error removal is described below.

As an embodiment, the verification error removal circuit 413_1 may disable an output path of the first verification signal VFY_S1 when an error is included in the first verification signal VFY_S1.

In the present specification, the output path of the verification signal may include a signal line from the verification error removal circuit to the mass bit counter. In some embodiments, the verification error removal circuit 413_1 may transmit a signal having a fixed arbitrary level to the mass bit counter 420 instead of the first verification signal VFY_S1 including an error. However, this is an example embodiment and is not limited thereto, and various structural implementations may be applied to the verification error removal circuit 413_1 to prevent the first verification signal VFY_S1 including an error from being used for the operation of the mass bit counter 420. As an embodiment, the verification error removal circuit 413_1 may activate an output path of the first verification signal VFY_S1 and transmit the first verification signal VFY_S1 to the mass bit counter 420 when the first verification signal VFY_S1 does not include an error.

Figure 6:
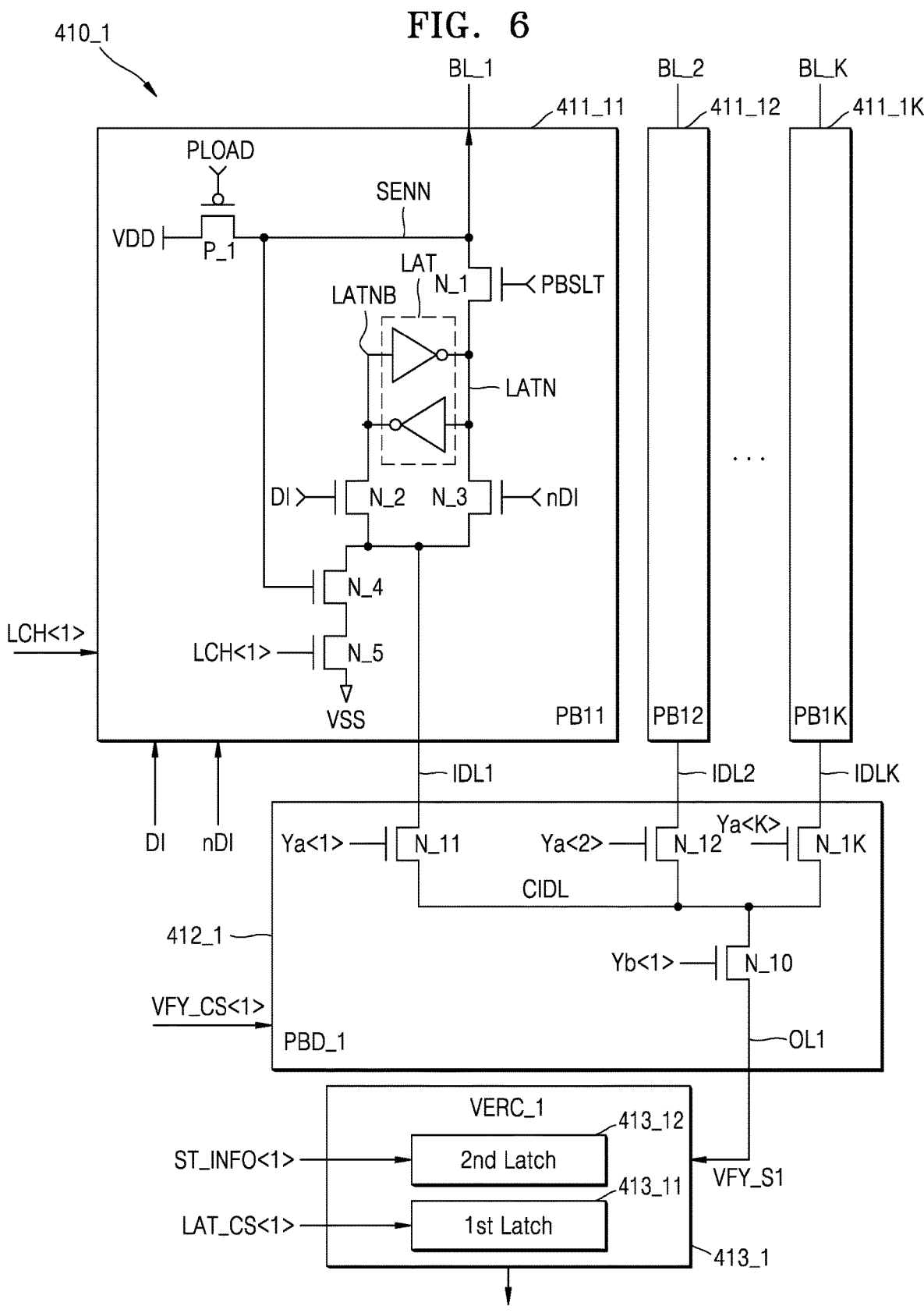
FIG. 6 is a diagram for explaining an implementation example of a first page buffer block of FIG. 5.

FIG. 6 is a diagram for explaining an implementation example of the first page buffer block 410_1 of FIG. 5.

It will be sufficiently understood that the implementation example of the first page buffer block 410_1 of FIG. 6 is applied to the remaining page buffer blocks 410_2 to 410_K of FIG. 5. Referring to FIG. 6, the first page buffer block 410_1 may include first to $K^{th}$ page buffers 411_11 to 411_1K, a page buffer decoder 412_1 and a verification error removal circuit 413_1.

The first page buffer 411_11 may include a plurality of transistors N_1 to N_5 and a latch LAT that stores a verification read result of a memory cell connected to the first bit line BL_1. Each of the plurality of transistors N_1 to N_5 may be controlled by a load control signal PLOAD, a page buffer select signal PBSLT, a data input select signal DI, a data input select inversion signal nDI, and a latch signal LCH<1>. The latch LAT may be connected to a latch node LATN and a latch inversion node LATNB, and during a verification operation, when a memory cell connected to the first bit line BL_1 is an on-cell, the latch node LATN may have a low level, and when the memory cell connected to the first bit line BL_1 is an off-cell, the latch node LATN may have a high level. The configuration of the first page buffer 411_11 may be applied to the remaining page buffers 411_12 to 411_1K.

The first to $N^{th}$ page buffers 411_11 to 411_1K may be connected to the page buffer decoder 412_1 through internal data lines IDL1 to IDLK, respectively. The page buffer decoder 412_1 may include a plurality of first select transistors N_11 to N_1K connected between the page buffers 411_12 to 411_1K and the common internal data line CIDL and a second select transistor N_10 connected between the common internal data line CIDL and the global data line GDL.

On/off of the select transistors N_11 to N_1K and N_10 may be controlled by a verification control signal VFY_CS<1>. In an embodiment, the verification control signal VFY_CS<1> may include first control signals Ya<1> to Ya<K> that control on/off of the first select transistors N_11 to N_1K and a second control signal Yb<1> that controls on/off of the second select transistor N_10. The page buffer decoder 412_1 transmits the first verification signal VFY_S1 generated based on the first verification control signal VFY_CS<1> to the verification error removal circuit 413_1 through the first output line OL1. As an embodiment, the verification error removal circuit 413_1 may include a first latch 413_11 and a second latch 413_12.

In some embodiments, the second latch 413_12 may be implemented to be disposed outside the verification error removal circuit 413_1. The second latch 413_12 may receive state information ST_INFO<1> from the outside and store the state information ST_INFO<1>. The state information ST_INFO<1> may indicate whether at least one bit line or at least one page buffer related to the first verification signal VFY_S1 is defective. Afterwards, the state information ST_INFO<1> stored in the second latch 413_12 may be transferred to the first latch 413_11 through the first output line OL1 based on the latch control signal LAT_CS<1>. As an embodiment, the verification error removal circuit 413_1 may control an output path of the first verification signal VFY_S1 based on a path control signal generated from the output of the first latch 413_11 and the first verification signal VFY_S1.

Figure 7:
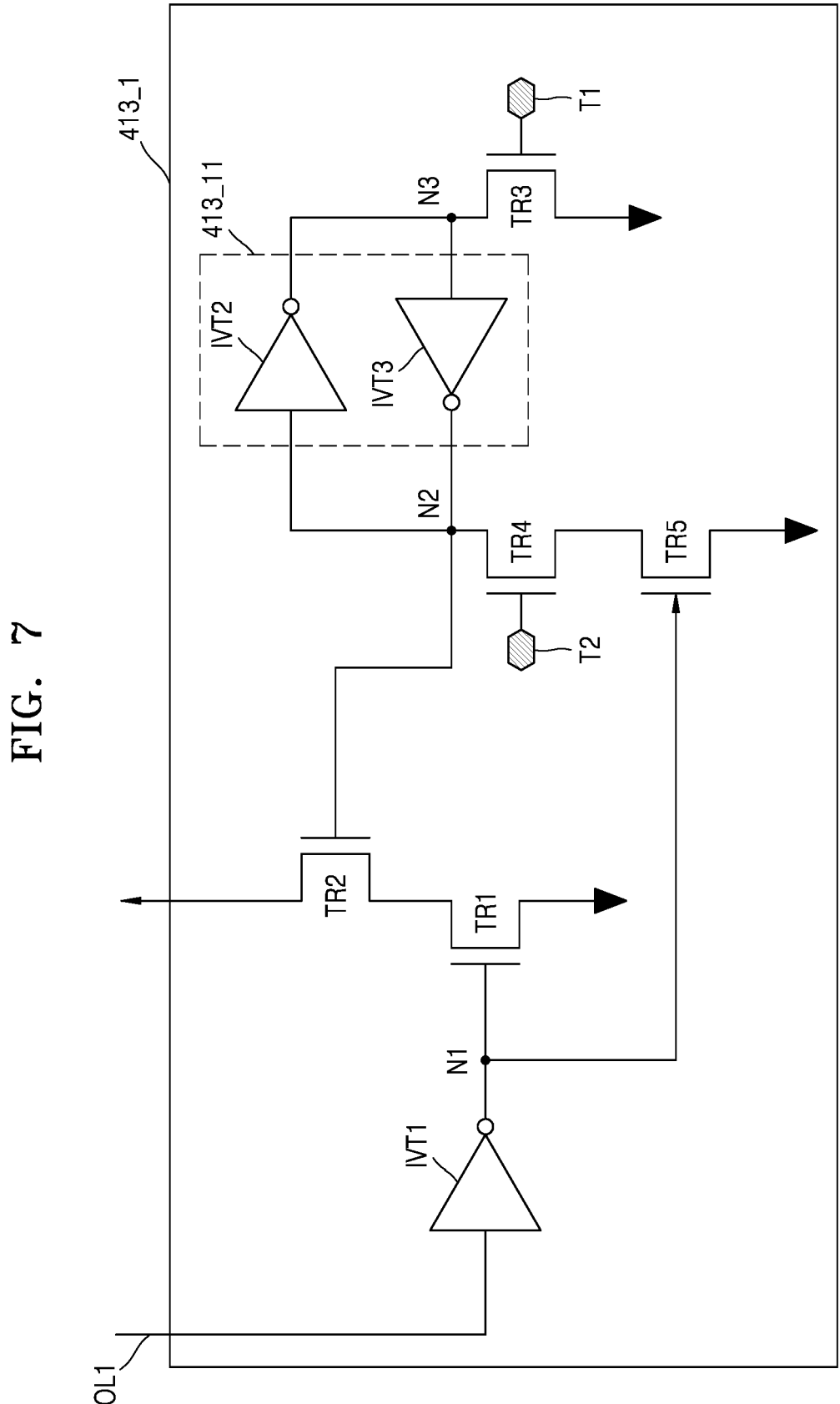
FIG. 7 is a diagram for explaining an implementation example of a verification error removal circuit of FIG. 6.

As an embodiment, the path control signal may be a signal generated by inverting the first verification signal VFY_S1. FIG. 7 is a diagram for explaining an implementation example of the verification error removal circuit 413_1 of FIG. 6.

Referring to FIG. 7, the verification error removal circuit 413_1 includes a first inverter IVT1, first to fifth n-type transistors TR1 to TR5, a second inverter IVT2, a third inverter IVT3, a first terminal T1, and a second terminal T2.

In an embodiment, an input terminal of the first inverter IVT1 may be connected to the first output line OL1, and an output terminal of the first inverter IVT1 may be connected to a gate terminal of the first n-type transistor TR1 at a first node N1.

In an embodiment, a drain terminal of the first n-type transistor TR1 may be connected to a drain terminal of the second n-type transistor TR2 and a source terminal of the first n-type transistor TR1 may be grounded.

In an embodiment, a gate terminal of the second n-type transistor TR2 may be connected to a second node N2.

Also, as an embodiment, the first n-type transistor TR1 and the second n-type transistor TR2 may constitute a part of an output path of the first verification signal VFY_S1 (refer to FIG. 6), and the verification error removal circuit 413_1 may control an output path by controlling on/off of the first n-type transistor TR1 and the second n-type transistor TR2. As an embodiment, the second inverter IVT2 and the third inverter IVT3 may be connected in parallel to each other to form a first latch 413_11, and an output terminal of the first latch 413_11 may be connected to the second node N2, and an input terminal of the first latch 413_11 may be connected to a third node N3.

In the present specification, an output of the first latch 413_11 may correspond to a voltage of the second node N2. In an embodiment, a gate terminal of the third n-type transistor TR3 is connected to the first terminal T1 to receive a reset signal for the first latch 413_11, and a drain terminal of the third n-type transistor TR3 may be connected to the third node N3, and a source terminal of the third n-type transistor TR3 may be grounded.

In an embodiment, a gate terminal of the fourth n-type transistor TR4 may be connected to the second terminal T2 to receive a set signal for the first latch 413_11, and a drain terminal of the fourth n-type transistor TR4 may be connected to the second node N2, and a source terminal of the fourth n-type transistor TR4 may be connected to the drain terminal of the fifth n-type transistor TR5.

That is, the fourth n-type transistor TR4 and the fifth n-type transistor TR5 may be connected to each other in a cascade manner. In an embodiment, a gate terminal of the fifth n-type transistor TR5 may be connected to the first node N1 and a source terminal of the fifth n-type transistor TR5 may be grounded.

In the present specification, a reset signal input to the first terminal T1 and a set signal input to the second terminal T2 may be included in the aforementioned latch control signal.

However, the implementation shown in FIG. 7 is only an example, and is not limited thereto, and various implementations may be applied to the verification error removal circuit 413_1 to prevent a verification signal including an error from being used for the operation of the mass bit counter.

Figure 8A:
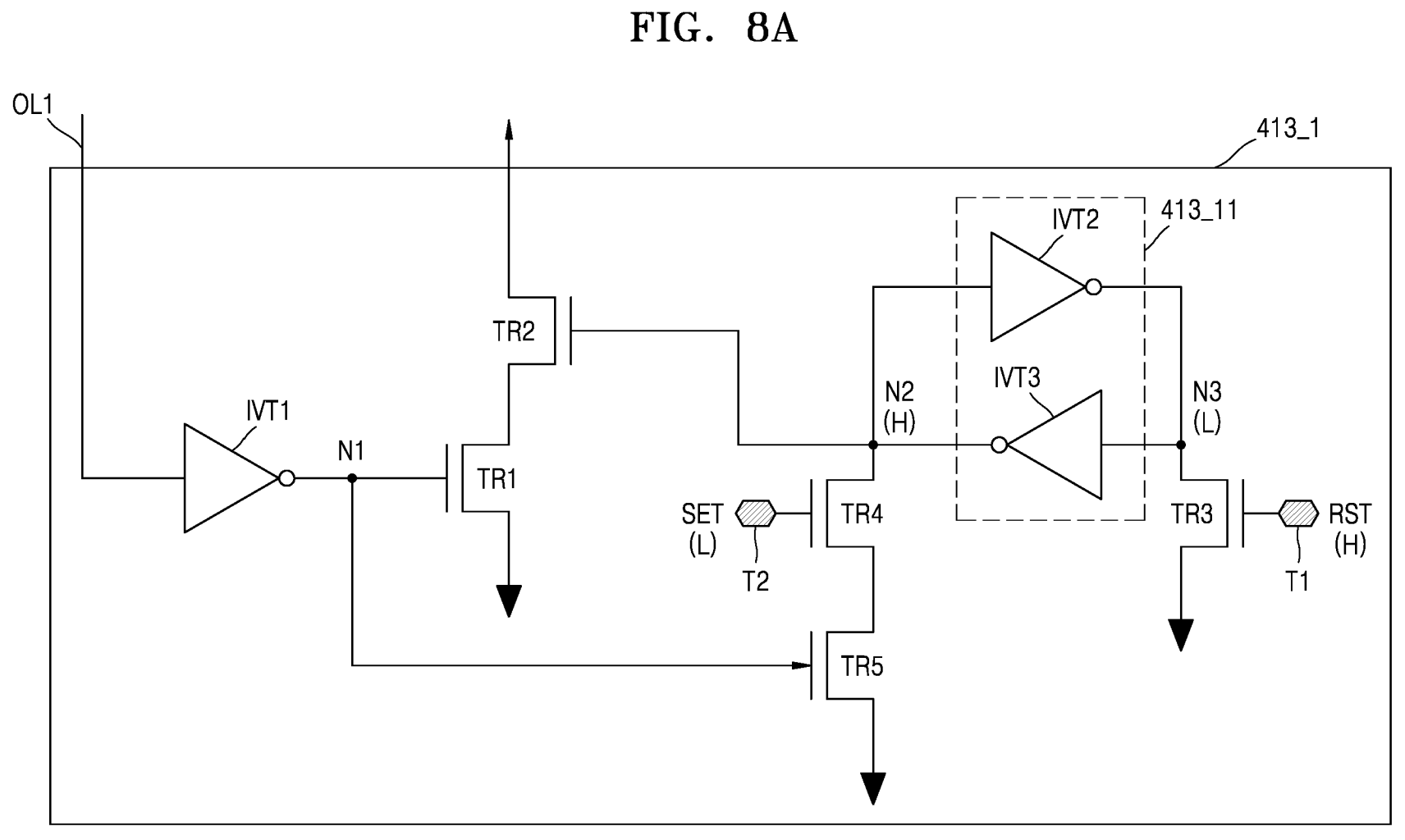
Figure 8B:
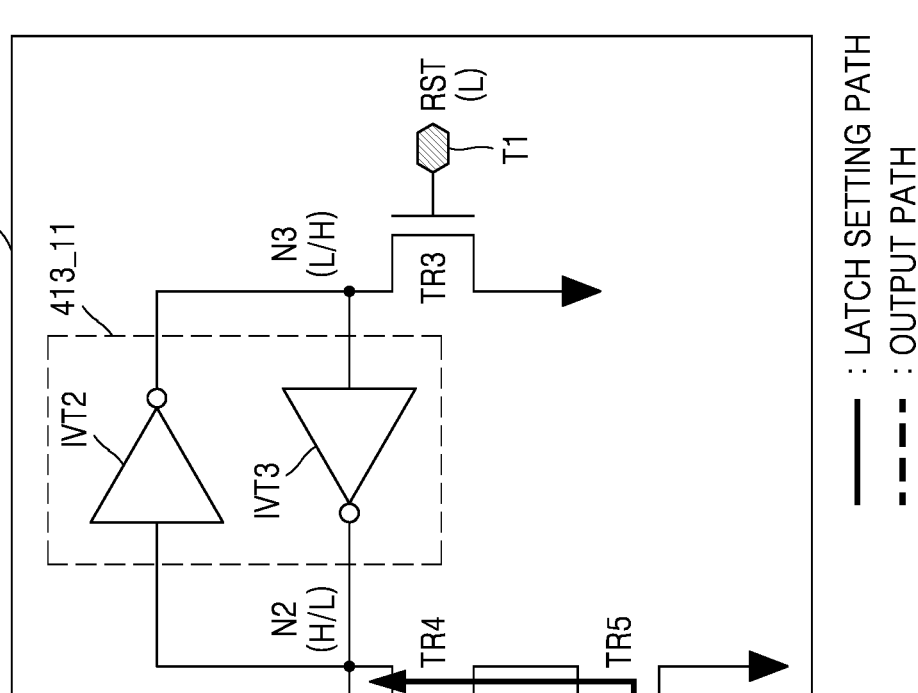

FIGS. 8A to 8C are diagrams for explaining the operation of the verification error removal circuit 413_1 of FIG. 7.

Hereinafter, descriptions previously given with reference to FIG. 7 are omitted. Referring to FIG. 8A, a high level H reset signal RST is input to the first terminal T1, and a low level L set signal SET is input to the second terminal T2, and thus, the first latch 413_11 may be reset.

Specifically, an output terminal of the first latch 413_11 may be reset to a high level H, and an input terminal of the first latch 413_11 may be reset to a low level L. Referring further to FIG. 8B, an output path of the first verification signal VFY_S1 may be formed after a latch setting path is formed in the verification error removal circuit 413_1.

The latch setting path and the output path may include the first output line OL1. As an embodiment, the first latch 413_11 may store state information ST_INFO<1> related to the first verification signal VFY_S1 through the latch setting path.

For example, in the case of assuming that the first output line OL1 is normal, when the state information ST_INFO<1> is a low level that indicates a defect, the output terminal of the first latch 413_11 is set to a low level L, and when the state information ST_INFO<1> is a high level that indicates normal, the output terminal of the first latch 413_11 may be set to a high level H. As an embodiment, the first verification signal VFY_S1 is input to the first inverter IVT1 through an output path, and the first inverter IVT1 may invert the first verification signal VFY_S1 and output as a path control signal P_CS to the gate terminal of the first n-type transistor TR1.

Also, the gate terminal of the second n-type transistor TR2 may receive an output LAT_OUT of the first latch 413_11. In an embodiment, the output path may be activated or deactivated by the first n-type transistor TR1 and the second n-type transistor TR2 based on the path control signal P_CS and the output LAT_OUT of the first latch 413_11.

Further referring to a table TB of FIG. 8C, a defective state may include first to third defective states.

The first defective state is a case when an output line is normal, but at least one bit line or at least one page buffer is defective, the second defective state is a case when the output line includes a stuck defect at a low level, and the third defective state a case is when the output line includes a stuck defect at a high level. In the present specification, when an output line includes a stuck defect at a specific level (i.e., low level or high level), a level of a signal transferred (or transmitted) by the output line may be defined as being fixed to the specific level (i.e., the low level or the high level). The first defective state may be identified through state information stored in the first latch 413_11, but the second and third defective states may not be identified through the state information.

The verification error removal circuit 413_1 according to an embodiment disables the output path of the first verification signal VFY_S1 even in the second or third defective state, and excludes the first verification signal VFY_S1 from the mass bit count operation. For example, in the first defective state, the first verification signal VFY_S1 may be at a high level H or low level L, and the path control signal P_CS may be at a low level L or high level H.

However, due to the state information stored in the first latch 413_11 indicating the first defective state, the output LAT_OUT of the first latch 413_11 is at a low level L, and accordingly, the second n-type transistor TR2 is turned off and the output path may be deactivated. For example, in the second defective state, the first verification signal VFY_S1 may be at a low level L and the path control signal P_CS may be at a high level H.

Meanwhile, the second defective state is a state in which incorrect state information is stored in the first latch 413_11 due to a defect in the first output line OL1. To compensate for this state, the path control signal P_CS of a high level H is input to the gate terminal of the fifth n-type transistor TR5, and then, the output LAT_OUT of the first latch 413_11 may have a low level L. Through this operation, even in a state when incorrect state information is stored in the first latch 413_11, the second n-type transistor TR2 is turned off and the output path may be disabled. For example, in the third defective state, the first verification signal VFY_S1 may be at a high level H and the path control signal P_CS may be at a low level L.

Meanwhile, in the second defective state, it may be in a state that incorrect state information is stored in the first latch 413_11 due to a defect in the first output line OL1. In order to compensate for this state, the path control signal P_CS at a low-level L is input to the gate terminal of the first n-type transistor TR1 to turn off the first n-type transistor TR1, and thus, the output path may be disabled. For example, in a normal state, the first verification signal VFY_S1 may be at a high level H or a low level L, and the path control signal P_CS may be at a low level L or a high level H.

Meanwhile, due to state information stored in the first latch 413_11 indicating a normal state, the output LAT_OUT of the first latch 413_11 may be at a high level H. An output path of the first verification signal VFY_S1 is controlled according to a level of the first verification signal VFY_S1, and thus, the first verification signal VFY_S1 may be included in a mass bit count operation. However, the embodiments described with reference to FIGS. 8A to 8C are merely illustrative, and are not limited thereto, and various implementations for excluding the first verification signal VFY_S1 including an error due to a defect of the first output line OL1 from the mass bit count operation may be applied to the verification error removal circuit 413_1.

Figure 9:
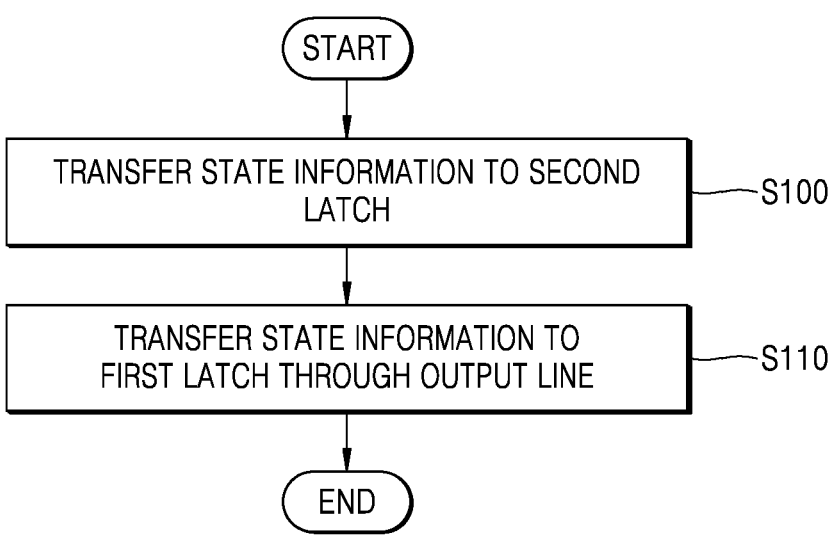
FIG. 9 is a flowchart illustrating an operating method of a memory device, according to an embodiment.

FIG. 9 is a flowchart illustrating a method of operating a memory device according to an embodiment.

Referring to FIG. 9, in operation S100, the memory device may transfer state information indicating whether or not at least one bit line or at least one page buffer related to a verification signal is defective to a second latch of a verification error removal circuit.

As an example, the second latch may temporarily store the transferred state information. In operation S110, the memory device may transfer state information stored in the second latch to the first latch of the verification error removal circuit through an output line for transferring a verification signal.

Figure 10:
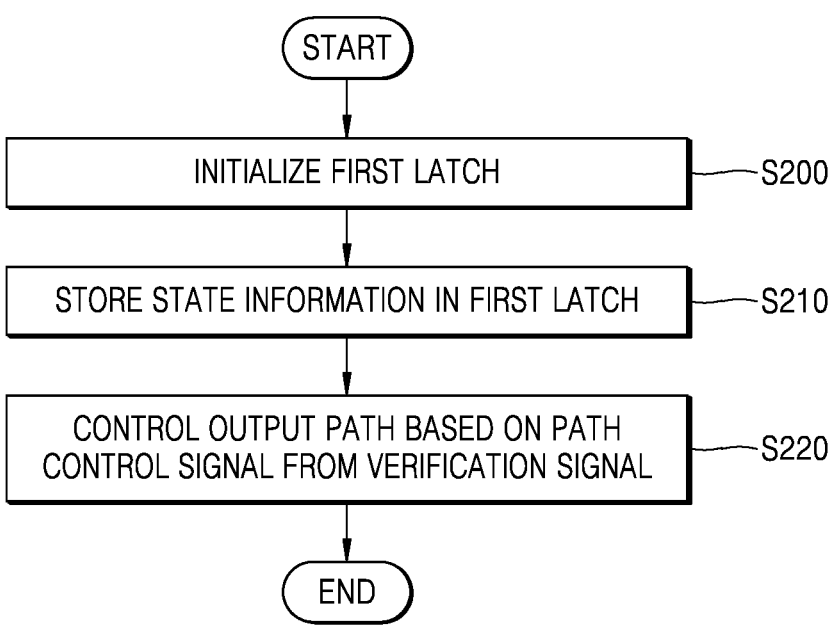
FIG. 10 is a flowchart for explaining a specific embodiment of operation S110 of the method of FIG. 9.

As an example, the first latch may store the transferred state information based on the latch control signal. FIG. 10 is a flowchart for explaining a specific embodiment of operation S110 of FIG. 9.

Referring to FIG. 10, in operation S200, the memory device may initialize the first latch.

For example, the memory device may initialize the first latch by applying a high-level reset signal to the first latch. In operation S210, the memory device may store the state information in the first latch.

As an example, the memory device may store the state information in the first latch by applying a high-level set signal to the first latch and transferring the state information stored in the second latch to the first latch through an output line. In operation S220, the memory device may control an output path through which the verification signal is transferred based on a path control signal generated from the verification signal.

Figure 11:
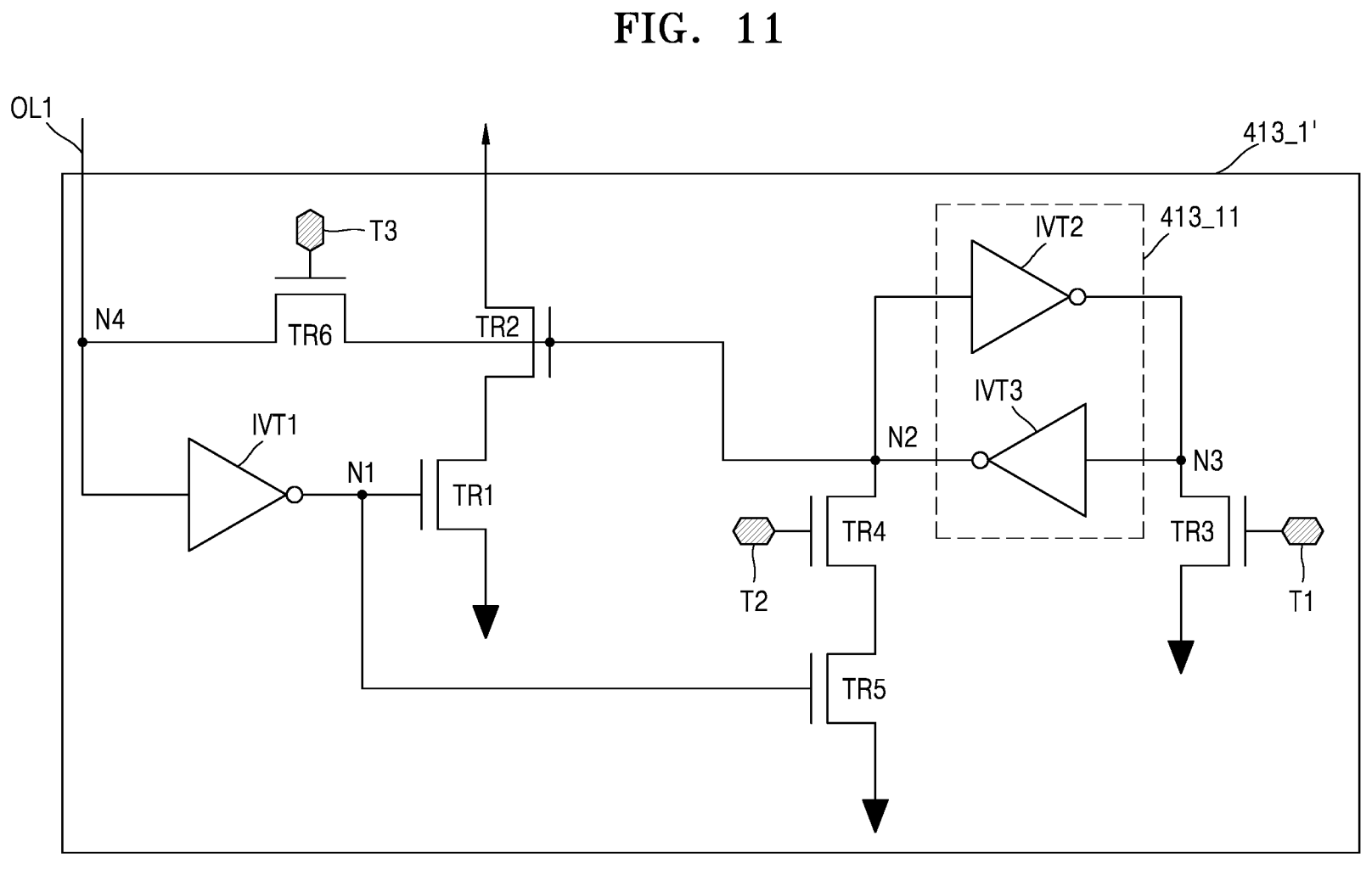

As an example, the output path may include a line formed between the page buffer block and a mass bit counter. Also, the memory device may control the output path based on an output of the first latch. FIG. 11 is a diagram for explaining an implementation example of a verification error removal circuit 413_1' according to another embodiment.

In describing the verification error removal circuit 413_1' of FIG. 11, configurations different from the verification error removal circuit 413_1 of FIG. 7 will be mainly described, and descriptions already given with FIG. 7 will be omitted. Referring to FIG. 11, the verification error removal circuit 413_1' includes a first inverter IVT1, first to sixth n-type transistors TR1 to TR6, a second inverter IVT2, a third inverter IVT3, a first terminal T1, a second terminal T2, and a third terminal T3.

In an embodiment, a gate terminal of the sixth n-type transistor TR6 is connected to the third terminal T3, and a drain terminal of the sixth n-type transistor TR6 is connected to the second node N2, and a source terminal of the sixth n-type transistor TR6 may be connected to a first output line OL1 through a fourth node N4.

As an embodiment, the sixth n-type transistor TR6 may be used to test the first latch 413_11 in a mass production stage of the memory device.

Specifically, the sixth n-type transistor TR6 may be turned on when a high-level latch test signal is input to the third terminal T3 in a test period of the first latch 413_11. During the test period, the sixth n-type transistor TR6 may receive an output of the first latch 413_11 through the second node N2 and transfer the output to the fourth node N4. As an embodiment, the output of the first latch 413_11 transferred to the fourth node N4 may be compared with reference state information, and based on a comparison result, whether the first latch 413_11 is defective may be tested.

Figure 12:
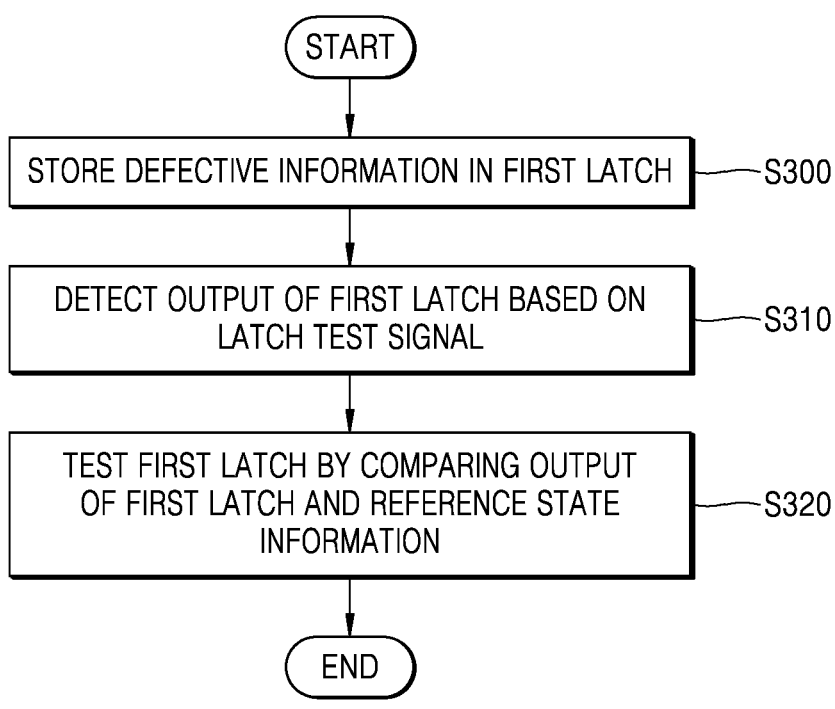
FIG. 12 is a flowchart illustrating a method of testing a first latch of a memory device, according to an embodiment.

FIG. 12 is a flowchart illustrating a method of testing a first latch of a memory device according to an embodiment.

Referring to FIG. 12, in operation S300, the memory device may store reference state information in the first latch of the verification error removal circuit by a test device.

In operation S310, the memory device may detect an output of the first latch based on a latch test signal by the test device.

As an example, the memory device may detect the output of the first latch through an output signal transferring a verification signal and state information. In operation S320, the memory device may test the first latch by comparing the output of the first latch with the reference state information.

Figure 13:
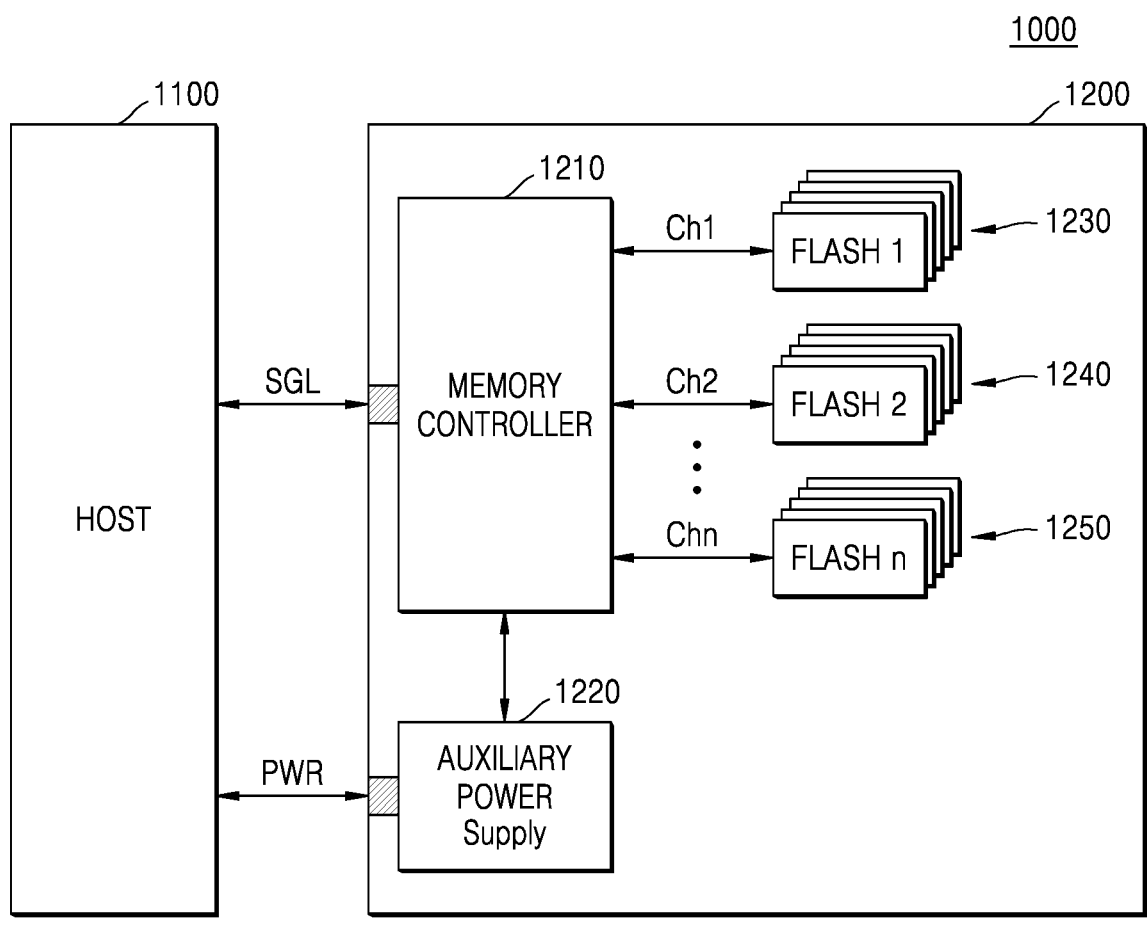
FIG. 13 is a block diagram illustrating a solid state drive (SSD) system according to an embodiment.

FIG. 13 is a block diagram illustrating a solid state drive (SSD) system 1000 according to an embodiment.

Referring to FIG. 13, the SSD system 1000 may include a host 1100 and an SSD 1200.

The SSD 1200 may exchange signals SGL with the host 1100 through a signal connector, and may receive power PWR through a power connector. The SSD 1200 may include a memory controller 1210, an auxiliary power supply 1220, and a plurality of memory devices 1230, 1240, and 1250. The plurality of memory devices 1230, 1240, and 1250 may be connected to the memory controller 1210 through channels Ch1 to Chn to perform a mass bit count operation according to embodiments.

Specifically, the plurality of memory devices 1230, 1240, and 1250 may include verification error removal circuits according to the above-described embodiments, and the verification signals including errors may be excluded from the mass bit count operation using the verification error removal circuits. While aspects of the inventive concept have been particularly shown and described with reference to embodiments thereof, it will be understood that various changes in form and details may be made therein without departing from the spirit and scope of the following claims.

What is claimed is:

1. A memory device comprising:
a memory cell array including a plurality of memory cells;
a control logic configured to control a verification operation for the plurality of memory cells; and
a page buffer block including a plurality of page buffers connected to the memory cell array through bit lines, a page buffer decoder that outputs, through an output line, a verification signal generated from at least one of outputs of the plurality of page buffers by the verification operation, and a verification error removal circuit connected to the output line and configured to control an output path of the verification signal to the control logic,
wherein the verification error removal circuit includes a first latch configured to store state information indicating whether at least one bit line or at least one page buffer related to the verification signal is defective, and is configured to control the output path, based on an output of the first latch and a path control signal generated from the verification signal.

2. The memory device of claim 1, wherein a low level of the state information indicates a defective state and a high level of the state information indicates a normal state.

3. The memory device of claim 1, wherein the output line is used to transfer state information to the first latch.

4. The memory device of claim 1, wherein the verification error removal circuit is configured to disable the output path, based on the path control signal, when the output line includes a stuck defect at a high level, and to disable the output path, based on the output of the first latch, when the output line includes a stuck defect at a low level.

5. The memory device of claim 1, wherein the verification error removal circuit is configured to disable the output path, based on the output of the first latch, when the state information indicates that the at least one bit line or the at least one page buffer is defective.

6. The memory device of claim 1, wherein the control logic is configured to perform an off-cell count operation on the plurality of memory cells, based on the verification signal.

7. The memory device of claim 1, wherein the verification error removal circuit includes:
an inverter configured to invert the verification signal received through the output line and output the inverted verification signal as the path control signal;
a first n-type transistor configured to receive the path control signal through a gate terminal; and
a second n-type transistor configured to receive an output of the first latch through a gate terminal,
wherein the first n-type transistor and the second n-type transistor comprise a part of the output path.

8. The memory device of claim 7, wherein the verification error removal circuit further includes:
a third n-type transistor configured to reset the first latch; and
a fourth n-type transistor and a fifth n-type transistor coupled to each other in a cascade manner to store the state information in the first latch.

9. The memory device of claim 8, wherein the third n-type transistor is configured to receive a reset signal through a gate terminal,
the fourth n-type transistor is configured to receive a set signal through a gate terminal, and
the fifth n-type transistor is configured to receive the path control signal through a gate terminal.

10. The memory device of claim 7, wherein the verification error removal circuit is further configured to include a sixth n-type transistor configured to transfer the output of the first latch received through a drain terminal in a test period of the first latch, to the output line through a source terminal.

11. The memory device of claim 1, wherein the verification error removal circuit further includes a second latch configured to store the state information before the state information is stored in the first latch.

12. The memory device of claim 11, wherein the state information is transferred from the second latch to the first latch through the output line.

13. The memory device of claim 1, wherein the verification error removal circuit is configured to enable or disable the output path based on the path control signal and the output of the first latch.

14. The memory device of claim 1, wherein the plurality of memory cells include vertically stacked nonvolatile memory cells.

15. A page buffer block comprising:
a plurality of page buffers connected to a memory cell array through bit lines;
a page buffer decoder configured to output, through an output line, a verification signal generated by selecting at least one output from the plurality of page buffers; and
a verification error removal circuit connected to the output line and configured to control enabling or disabling of an output path of the verification signal,
wherein the verification error removal circuit includes a first latch configured to store state information indicating whether at least one bit line or at least one page buffer related to the verification signal is defective, and is configured to control the output path the state information and a path control signal generated from the verification signal.

16. The page buffer block of claim 15, wherein the verification error removal circuit includes:

an inverter configured to invert the verification signal received through the output line and output the inverted verification signal as the path control signal;

a first n-type transistor configured to receive the path control signal through a gate terminal; and a second n-type transistor configured to receive an output of the first latch through a gate terminal, wherein the first n-type transistor and the second n-type transistor comprise a part of the output path.

17. The page buffer block of claim 16, wherein the second n-type transistor is configured to be turned off in response to an output of the first latch at a low level, when the state information has a low level indicating a defective state.

18. The page buffer block of claim 16, wherein the first n-type transistor is configured to be turned off in response to the path control signal at a low level, when the output line includes a stuck defect at a high level.

19. The page buffer block of claim 16, wherein the output line is used to transfer the state information to the first latch.

20. The page buffer block of claim 16, wherein the verification error removal circuit further includes a second latch configured to store the state information before the state information is stored in the first latch, wherein the state information is transferred from the second latch to the first latch through the output line.

* * * * *